(12) United States Patent
Mun et al.

(10) Patent No.: US 11,456,306 B2
(45) Date of Patent: Sep. 27, 2022

(54) NONVOLATILE MEMORY DEVICE WITH A METAL-INSULATOR-METAL (MIM) CAPACITOR IN A SUBSTRATE AND INTEGRATION SCHEMES

(71) Applicant: GLOBALFOUNDRIES Singapore Pte. Ltd., Singapore (SG)

(72) Inventors: Bong Woong Mun, Singapore (SG); Jeoung Mo Koo, Singapore (SG)

(73) Assignee: GLOBALFOUNDRIES Singapore Ptd. Ltd., Singapore (SG)

( * ) Notice: Subject to any disclaimer, the term of this patent is extended or adjusted under 35 U.S.C. 154(b) by 73 days.

(21) Appl. No.: 17/100,954

(22) Filed: Nov. 23, 2020

(65) Prior Publication Data

US 2022/0165739 A1    May 26, 2022

(51) Int. Cl.
| | |
|---|---|
| *H01L 27/11521* | (2017.01) |
| *H01L 49/02* | (2006.01) |
| *H01L 29/06* | (2006.01) |
| *H01L 29/788* | (2006.01) |
| *H01L 29/66* | (2006.01) |

(52) U.S. Cl.
CPC ........ *H01L 27/11521* (2013.01); *H01L 28/60* (2013.01); *H01L 29/0653* (2013.01); *H01L 29/66825* (2013.01); *H01L 29/7885* (2013.01)

(58) Field of Classification Search
CPC ......... H01L 27/10802; H01L 27/10832; H01L 27/10829; H01L 27/11521
See application file for complete search history.

(56) References Cited

U.S. PATENT DOCUMENTS

| | | |
|---|---|---|
| 5,998,264 A | 12/1999 | Wu |
| 7,741,188 B2 | 6/2010 | Dyer et al. |
| 9,406,764 B2 | 8/2016 | Shum et al. |
| 2015/0001608 A1 | 1/2015 | Tan et al. |

OTHER PUBLICATIONS

Ye Lin et al., Physical and Electrical Characterization of 3D Embedded Capacitor: A High-density MIM Capacitor Embedded in TSV, 2017 IEEE 67th Electronic Components and Technology Conference, 2017, pp. 1956-1961, IEEE.

*Primary Examiner* — John A Bodnar
(74) *Attorney, Agent, or Firm* — David Cain

(57) ABSTRACT

A nonvolatile memory device is provided. The nonvolatile memory device comprises a floating gate arranged over a first active region, whereby the first active region is in an active layer of a substrate. A metal-insulator-metal (MIM) capacitor may be provided laterally adjacent to the floating gate, whereby a portion of the metal-insulator-metal capacitor is in the active layer. A contact pillar may connect a first electrode of the metal-insulator-metal capacitor to the floating gate.

16 Claims, 5 Drawing Sheets

View A-A'

View A-A'

View A-A'

View A-A'

View A-A'  FIG. 6

View A-A'

US 11,456,306 B2

NONVOLATILE MEMORY DEVICE WITH A METAL-INSULATOR-METAL (MIM) CAPACITOR IN A SUBSTRATE AND INTEGRATION SCHEMES

FIELD OF THE INVENTION

The disclosed embodiments relate generally to nonvolatile memory devices, and more particularly, to nonvolatile memory devices with a metal-insulator-metal (MIM) capacitor in a substrate and integration schemes.

BACKGROUND

A nonvolatile memory device retains stored data even if power is turned off. An example of a nonvolatile memory device includes electrically erasable programmable read only memory (EEPROM) and flash EEPROM. In typical flash memory architecture, a floating gate may be used to store charges. The floating gate may be arranged over an active region such as a p-well. A source region may be formed in the p-well adjacent to a first side of the floating gate and a drain region may be formed in the p-well adjacent to a second side of the floating gate opposite to the first side. A metal-insulator-metal capacitor may be used to bias the floating gate. The metal-insulator-metal capacitor is in a back-end-of line (BEOL) layer over the floating gate. The term "back-end-of line" may refer to a portion of a semiconductor processing that creates conductive lines carrying power and signals between devices such as transistors to a semiconductor chip interface.

A coupling ratio of the nonvolatile memory device with the metal-insulator-metal capacitor in the back-end-of-line layer over the floating gate is insufficient due to space constraints in the back-end-of-line layer. The issue is further aggravated for advanced technology nodes as feature sizes of the nonvolatile memory device shrinks. The low coupling ratio leads to higher program and erase voltages and a shorter device lifetime. Thus, there is a need to overcome the challenges mentioned above.

SUMMARY

In an aspect of the present disclosure, a nonvolatile memory device is provided. The nonvolatile memory device comprises a floating gate arranged over a first active region, whereby the first active region may be arranged in an active layer of a substrate. A metal-insulator-metal capacitor may be arranged laterally adjacent to the floating gate, whereby a portion of the metal-insulator-metal capacitor may be in the active layer. A contact pillar may connect a first electrode of the metal-insulator-metal capacitor to the floating gate.

In another aspect of the present disclosure, an array of nonvolatile memory devices is provided. The array of nonvolatile memory devices comprises a first active region and a second active region arranged in an active layer of a substrate. A first isolation region and a second isolation region adjacent to the first isolation region may be arranged between the first active region and the second active region. A first array of floating gates may be arranged over the first active region and a second array of floating gates may be arranged over the second active region. A metal-insulator-metal capacitor may be arranged laterally adjacent to the floating gates, whereby a lower portion of the metal-insulator-metal capacitor may be arranged in the first isolation region in the active layer and a first dielectric layer in the substrate. A contact pillar may connect a first electrode of the metal-insulator-metal capacitor to each floating gate.

In yet another aspect of the present disclosure, a method of fabricating a nonvolatile memory device is provided. The method comprises providing a floating gate arranged over a first active region, whereby the first active region may be arranged in an active layer of a substrate. A contact pillar may be provided over the floating gate. A metal-insulator-metal capacitor may be provided laterally adjacent to the floating gate, whereby a portion of the metal-insulator-metal capacitor may be arranged in the active layer and a first electrode of the metal-insulator-metal capacitor may be connected to the floating gate by the contact pillar.

Numerous advantages may be derived from the embodiments described below. The embodiments provide a nonvolatile memory device with a high coupling ratio. A second electrode of the metal-insulator-metal capacitor may be connected to an input terminal. The term "coupling ratio" may refer to the voltage transfer capability from the metal-insulator-metal capacitor to the floating gate. A lower portion of the metal-insulator-metal capacitor may be arranged in a first isolation region. An upper portion of the first isolation region may be surrounded by a second isolation region adjacent to the first active region leading to a compact nonvolatile memory device. The second isolation region may be a shallow trench isolation region. An extension portion of the metal-insulator-metal capacitor may be arranged over an inter metal dielectric (IMD) layer over the floating gate leading to a high capacitance value and a high coupling ratio. The metal-insulator-metal capacitor may extend across at least a length of an active region providing a high coupling ratio for the nonvolatile memory device. A lower portion of the metal-insulator-metal capacitor may be separated from a base layer of the substrate by a portion of the first dielectric layer. Thereby the metal-insulator-metal capacitor is electrically insulated from the base layer of the substrate, leading to a stable device operation.

BRIEF DESCRIPTION OF THE DRAWINGS

The disclosed embodiments will be better understood from a reading of the following detailed description, taken in conjunction with the accompanying drawings.

Figure 1A:
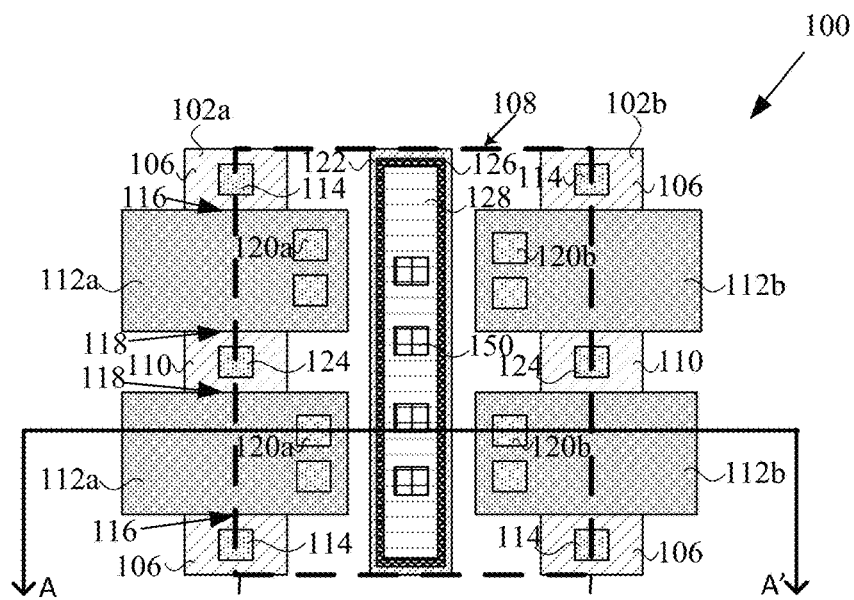
FIG. 1A is a top down view of a nonvolatile memory device array, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a top down view of a nonvolatile memory device array 100, according to an embodiment of the disclosure. Referring to FIG. 1A, a nonvolatile memory device array 100 is provided. The nonvolatile memory device array 100 may comprise a first active region 102a and a second active region 102b. A first array of floating gates 112a may be arranged over the first active region 102a and a second array of floating gates 112b may be arranged over the second active region 102b. A first doped region 106 may be arranged in the first 102a and the second 102b active regions next to a first side 116 of the first array 112a and the second array 112b of floating gates, respectively. A second doped region 110 may be arranged in the first 102a and the second 102b active regions next to a second side 118 of the first array 112a and the second array 112b of floating gates, respectively. The first side 116 of the floating gates 112a and 112b may be opposite to the second side 118. For example, the first doped region 106 may be a source, the second doped region 110 may be a drain and a floating gate 112a or 112b may be a charge storage region for a nonvolatile memory transistor. The term "floating gate" may refer to a gate electrode that is electrically isolated from an input terminal and may be capacitively coupled to the input terminal. There may not be direct current flowing from the input terminal to the floating gate during a reading operation.

A contact 114 may be arranged over the first doped region 106 and a contact 124 may be arranged over the second doped region 110 for connection to external input terminals. A metal-insulator-metal (MIM) capacitor 108 may be provided laterally adjacent to the floating gates 112a and 112b, whereby a lower portion of the metal-insulator-metal capacitor 108 may be arranged in a substrate. For simplicity, the substrate is not shown in FIG. 1A. An extension portion of the metal-insulator-metal capacitor 108 is depicted as a dashed outline. The extension portion of the metal-insulator-metal capacitor 108 may at least partially overlap laterally with a portion of the first 102a and the second 102b active regions and the first array 112a and the second array 112b of floating gates. In one embodiment, the metal-insulator-metal capacitor 108 may extend across at least part of a length of the first 102a and the second 102b active regions thereby providing a nonvolatile memory device array 100 with a high coupling ratio. In another embodiment, the metal-insulator-metal capacitor 108 may extend beyond the length of the first 102a and the second 102b active regions. A contact pillar 120a and 120b may connect a first electrode 122 of the metal-insulator-metal capacitor 108 to the first array 112a and the second array 112b of floating gates, respectively. A contact 150 may couple a second electrode 128 of the metal-insulator-metal capacitor 108 to an external input terminal.

Figure 1B:
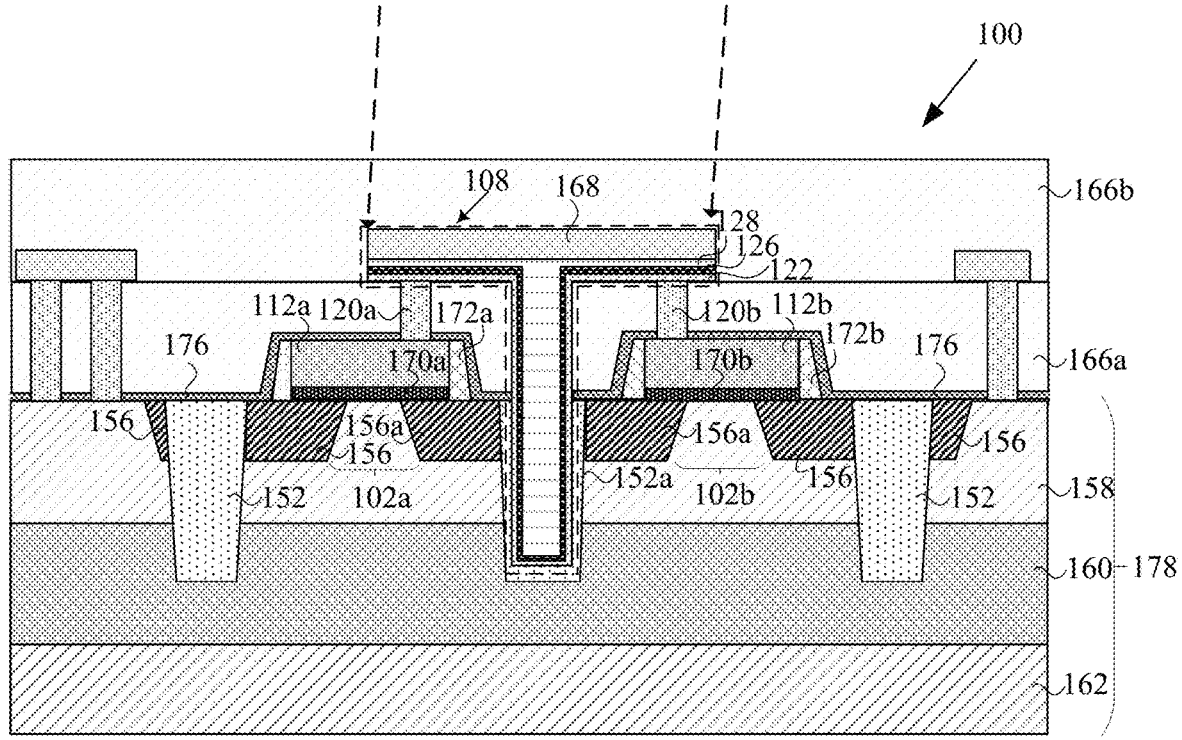
FIG. 1B is a cross-section view of the nonvolatile memory device array shown in FIG. 1A taken along section line A-A', according to an embodiment of the disclosure.

FIG. 1B is a cross-section view of the nonvolatile memory device array 100 shown in FIG. 1A taken along section line A-A', according to an embodiment of the disclosure. Referring to FIG. 1B, the first active region 102a and the second active region 102b may be in an active layer 158 of a substrate 178. A first isolation region 152a and a second isolation region 156a may be in the active layer 158 of the substrate 178 between the first 102a and the second 102b active regions. The first isolation region 152a may extend to a first dielectric layer 160 of the substrate 178 in one embodiment. In another embodiment, the first isolation region 152a may extend to an upper portion of the first dielectric layer 160. A lower portion of the metal-insulator-metal capacitor 108 may be positioned in the first isolation region 152a. In one embodiment, the lower portion of the capacitor 108 may extend vertically within the thickness of the active layer 158. In another embodiment, the lower portion of the capacitor 108 may extend vertically below the active layer 158 into the first dielectric layer 160 of the substrate 178 in one embodiment and in an upper portion of the first dielectric layer 160 of the substrate 178.

The first isolation region 152a may surround the lower portion of the metal-insulator-metal capacitor 108. In one embodiment, the first isolation region 152a may surround a side surface and a bottom surface of the lower portion of the metal-insulator-metal capacitor 108. In an alternative embodiment, the first isolation region 152a may surround the side surface of the lower portion of the metal-insulator-metal capacitor 108 and the bottom surface of the metal-insulator-metal capacitor 108 may be in contact with the first dielectric layer 160 of the substrate 178. The second isolation region 156a may be adjacent to an upper portion of the first isolation region 152a. In one embodiment, the second isolation region 156a may partially surround an upper portion of the first isolation region 152a. In another embodiment, the second isolation region 156a may completely surround the upper portion of the first isolation region 152a. The first isolation region 152a may be deep trench isolation (DTI) and the second isolation region 156a may be shallow trench isolation (STI). The first isolation region 152a may be within the second isolation region 156a. The lower portion of the metal-insulator-metal capacitor 108 does not take up additional lateral space as it may be in the first isolation region 152a. In one embodiment, the first 152a and the second 156a isolation regions may be between the lower portion of the metal-insulator-metal capacitor 108 and the first active region 102a below the first array of floating gates 112a and the second active region 102b below the second array of floating gates 112b.

Isolation regions 152 and 156 may be laterally adjacent to the first active region 102a or the second active region 102b. The isolation region 156 may be adjacent to an upper portion of the isolation region 152. The isolation region 156 may be a shallow trench isolation and the isolation region 152 may be a deep trench isolation. In an alternative embodiment, a lower portion of the metal-insulator-metal capacitor 108 may be arranged in the isolation region 152.

The substrate 178 may comprise a base layer 162, the first dielectric layer 160 over the base layer 162 and the active layer 158 over the first dielectric layer 160. In one embodiment, the base layer 162 may be made of a suitable semiconductor material, for example silicon. In one embodiment, the first dielectric layer 160 may be made of a suitable dielectric material, for example silicon dioxide. In one embodiment, the active layer 158 may be made of a suitable semiconductor material, for example silicon. In one embodiment, the substrate 178 may be silicon on insulator (SOI) substrate. In a preferred embodiment, the lower portion of the first dielectric layer 160 and a portion of the first isolation region 152 may be between the metal-insulator-metal capacitor 108 and the base layer 162 of the substrate 178 to electrically insulate the metal-insulator-metal capacitor 108 from the base layer 162 of the substrate leading to a stable device operation. In an alternative embodiment, the lower portion of the first dielectric layer 160 may be between the metal-insulator-metal capacitor 108 and the base layer 162 of the substrate 178. In yet another embodiment, a portion of the first isolation region 152a may be between the metal-insulator-metal capacitor 108 and the base layer 162 of the substrate 178.

Inter layer dielectric (ILD) layer 166a may be provided over the substrate 178. An upper portion of the metal-insulator-metal (MIM) capacitor 108 may extend vertically in the inter layer dielectric layer 166a above the substrate 178. Inter metal dielectric (IMD) layer 166b may be provided over the inter layer dielectric layer 166a. An extension portion of the upper portion of the metal-insulator-metal capacitor 108 may extend laterally in the inter metal dielectric layer 166b above the inter layer dielectric layer 166a and at least partially overlap laterally with the first 112a and the second 112b arrays of floating gates.

A first electrode 122 of the metal-insulator-metal capacitor 108 may be arranged on a side surface and a bottom surface of the metal-insulator-metal capacitor 108. For example, the first electrode 122 may be conformally formed on at least the side surfaces and the bottom surface of an opening 104 through the first isolation region 152a and the inter layer dielectric layer 166a. A dielectric layer 126 may be arranged over the first electrode 122 of the metal-insulator-metal capacitor 108. The dielectric layer 126 may be made of a high dielectric constant (high-k) dielectric layer in a preferred embodiment. The term "high dielectric constant dielectric layer" may refer to a layer of dielectric material with a dielectric constant greater than 20. In an alternative embodiment, the dielectric layer 126 may be made of silicon dioxide or silicon nitride ($Si_3N_4$). A second electrode 128 of the metal-insulator-metal capacitor 108 may be arranged over the high dielectric constant dielectric layer 126. A contact pillar 120a may connect the first electrode 122 of the metal-insulator-metal capacitor 108 to the first array of floating gates 112a. A contact pillar 120b may connect the first electrode 122 of the metal-insulator-metal capacitor 108 to the second array of floating gates 112b.

TABLE 1

|  | Metal-insulator-metal capacitor | Source | Drain | Substrate |
|---|---|---|---|---|
| Program | 12 V | 0 V | 12 V | 0 V |
| Erase | 0 V | 0 V | 18 V | 0 V |
| Read | 2.5 V | 0 V | 1 V | 0 V |

TABLE 1 illustrates an exemplary set of biasing conditions for the nonvolatile memory device array 100 shown in FIGS. 1A and 1B. Programming may be by hot carrier injection. For example, during program, a voltage of approximately 12 V may be applied to the metal-insulator-metal capacitor 108. 0 V may be applied to the first doped region 106 or the source of a selected nonvolatile memory transistor. A voltage of approximately 12 V may be applied to the second doped region 110 or the drain of a selected nonvolatile memory transistor. 0 V may be applied to the substrate 178 through the base region 162. The programming conditions create a strong vertically oriented electric field in a channel region between the first doped region 106 and the second doped region 110 of the selected nonvolatile memory transistor resulting in injection of hot electrons to an edge portion of a floating gate 112a or 112b of the selected nonvolatile memory transistor near the second doped region 110. The term "hot electrons" may refer to electrons that have gained a high kinetic energy as a result of a strong electric field.

Erasing may be by hot hole injection. During erase, for example, 0V may be applied to the metal-insulator-metal capacitor 108. A voltage of approximately 0 V may be applied to the first doped region 106 and the substrate 178 through the base region 162. A voltage of approximately 18 V may be applied to the second doped region 110. Hot holes may be generated in the channel region between the first doped region 106 and the second doped region 110 and injected into the floating gates 112a and 112b to recombine with the electrons stored in the floating gates 112a and 112b. The nonvolatile memory device array 100 may be erased simultaneously. The term "hot holes" may refer to holes that have gained a high kinetic energy as a result of a strong electric field.

During a reading operation, a voltage of approximately 2.5 V may be applied to the metal-insulator-metal capacitor 108 of a selected nonvolatile memory transistor. A voltage of approximately 1 V may be applied to the second doped region 110 or the drain of the selected nonvolatile memory transistor. 0 V may be applied to the first doped region 106 or the source and the substrate 178 through the base region 162. A current may be detected at the second doped region 110 depending on a threshold voltage of the selected nonvolatile memory transistor. For example, the threshold voltage of the selected nonvolatile memory transistor is low after erase and a current may be detected at the second doped region 110. A program operation may lead to a high threshold voltage of the selected nonvolatile memory transistor and less current or negligible current may be detected at the second doped region 110.

Figure 2:
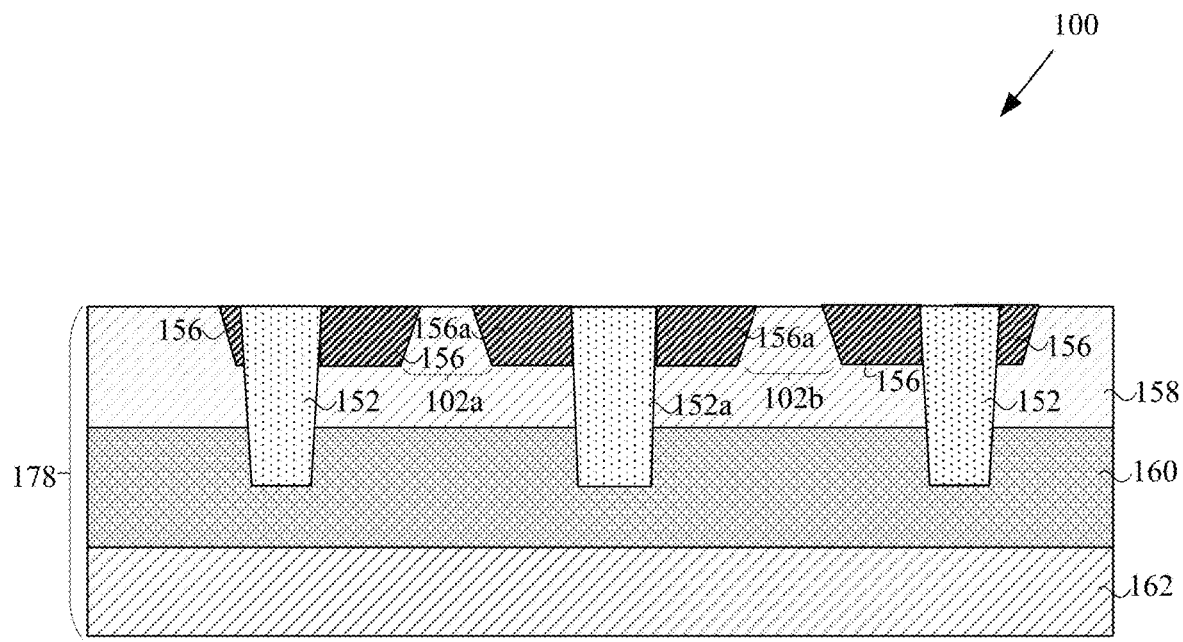
FIGS. 2 to 7 illustrate a fabrication process flow for the array of nonvolatile memory devices illustrated in FIG. 1B, according to some embodiments of the disclosure.

FIGS. 2 to 7 illustrate a fabrication process flow for the array of nonvolatile memory devices 100 illustrated in FIG. 1B, according to some embodiments of the disclosure. FIG. 2 is a cross-section view of a partially completed nonvolatile memory device array 100, according to an embodiment of the disclosure. Referring to FIG. 2, a substrate 178 may be provided. The substrate 178 may comprise a base layer 162, a first dielectric layer 160 arranged over the base layer 162 and an active layer 158 arranged over the first dielectric layer 160. A first isolation region 152a and a second isolation region 156a may be provided in the substrate 178. The second isolation region 156a may be adjacent to an upper portion of the first isolation region 152a. The first active region 102a and the second active region 102b may be formed adjacent to the second isolation region 156a. Isolation regions 152 and 156 may be provided in the substrate 178 adjacent to the first active region 102a or the second active region 102b. The second isolation region 156a and the isolation region 156 may thereby define an area of the first 102a and the second 102b active regions. In one embodiment, the first 102a and the second 102b active regions may be doped p-type to form a p-well region.

The formation of the second isolation region 156a and the isolation region 156 may include forming an opening in the active layer 158 by a conventional photolithography process followed by a wet or dry etch process. The conventional photolithography process may include depositing a photoresist layer over the active layer 158 followed by exposure and developing to form a photoresist pattern. A wet or dry etch process may be used to remove a portion of the active layer 158 not covered by the photoresist pattern to thereby form the opening in the active layer 158. The photoresist layer may subsequently be removed. A suitable dielectric material, for example borophosphosilicate glass (BPSG), tetraethyl orthosilicate (TEOS), or any other suitable dielectric material may be deposited into the opening in the active layer 158 by a suitable deposition process such as chemical vapor deposition (CVD), atomic layer deposition (ALD), physical vapor deposition (PVD) or any other suitable deposition processes. A suitable planarization process, such as chemical mechanical polishing (CMP) may be used to remove a portion of the borophosilicate glass layer from a top surface of the active layer 158 leaving behind another portion of the borophosphosilicate glass layer in the opening in the active layer 158 thereby forming the second isolation region 156a and the isolation region 156.

The formation of the first isolation region 152a and the isolation region 152 may include forming an opening in the second isolation region 156a and the isolation region 156, respectively, the active layer 158 and a portion of the first dielectric layer 160 by a conventional photolithography process followed by a wet or dry etch. A layer of suitable dielectric material, for example high density plasma (HDP) silicon dioxide or any other suitable dielectric material may be deposited in the opening by a suitable deposition process such as chemical vapor deposition, atomic layer deposition, physical vapor deposition or any other suitable deposition processes. A suitable planarization process, such as chemical mechanical polishing may be used to remove a portion of the silicon dioxide layer from a top surface of the second isolation region 156a and the isolation region 156 and the active layer 158 leaving behind another portion of the silicon dioxide layer in the opening in the second isolation region 156a and the isolation region 156, respectively, the active layer 158 and a portion of the first dielectric layer 160 thereby forming the first isolation region 152a and the isolation region 152, respectively.

Figure 3:
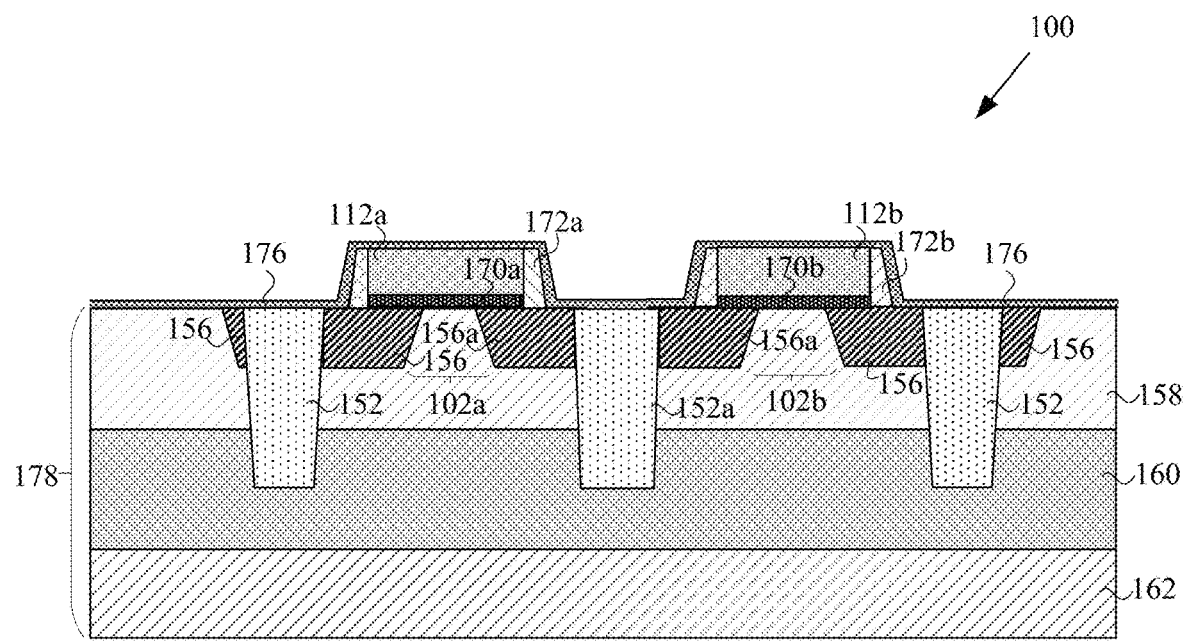

FIG. 3 is a cross-section view of a partially completed nonvolatile memory device array 100 after formation of a first array 112a and a second array 112b of floating gates, a spacer structure 172a and 172b, a gate dielectric layer 170a and 170b, and an etch stop layer 176, according to an embodiment of the disclosure. Referring to FIG. 3, a layer of suitable dielectric material, for example silicon dioxide, may be deposited over the active layer 158, the first active region 102a, the second active region 102b, the first isolation region 152a and the second isolation region 156a by a suitable deposition process such as chemical vapor deposition, atomic layer deposition, physical vapor deposition or any other suitable deposition processes. A layer of doped polysilicon may be deposited over the silicon dioxide layer by a suitable deposition process such as chemical vapor deposition, atomic layer deposition, physical vapor deposition or any other suitable deposition processes. In one embodiment, the polysilicon layer may be doped n-type. A conventional photolithography process followed by a wet or dry etch may be used to pattern the doped polysilicon layer and the silicon dioxide layer under the doped polysilicon layer to leave behind a portion of the doped polysilicon layer and the silicon dioxide layer over the first active region 102a thereby forming the first array of floating gates 112a and the gate dielectric layer 170a under the first array of floating gates 112a, respectively. Similarly, a conventional photolithography process followed by a wet or dry etch may be used to pattern the doped polysilicon layer and the silicon dioxide layer under the doped polysilicon layer to leave behind a portion of the doped polysilicon layer and the silicon dioxide layer over the second active region 102b thereby forming the second array of floating gates 112b and the gate dielectric layer 170b under the second array of floating gates 112b. A layer of suitable dielectric material such as silicon dioxide, silicon nitride ($Si_3N_4$) or silicon oxynitride (SiON) may be deposited over the first array 112a and the second array 112b of floating gates by a suitable deposition process such as chemical vapor deposition, atomic layer deposition, physical vapor deposition or any other suitable deposition processes. The silicon dioxide layer may be patterned by anisotropic etching to leave behind a portion of the silicon dioxide layer over a sidewall of the first array 112a and the second array 112b of floating gates to thereby form the spacer structures 172a and 172b, respectively. A layer of suitable dielectric material, for example silicon nitride may be deposited over the active layer 158, the first isolation region 152a, the second isolation region 156a, the isolation structures 152 and 156, the spacer structures 172a and 172b, the first array 112a and the second array 112b of floating gates by a suitable deposition process such as chemical vapor deposition, atomic layer deposition, physical vapor deposition or any other suitable deposition processes to thereby form the etch stop layer 176. The term "anisotropic etching" may refer to an etching process that is directional in nature.

Figure 4:
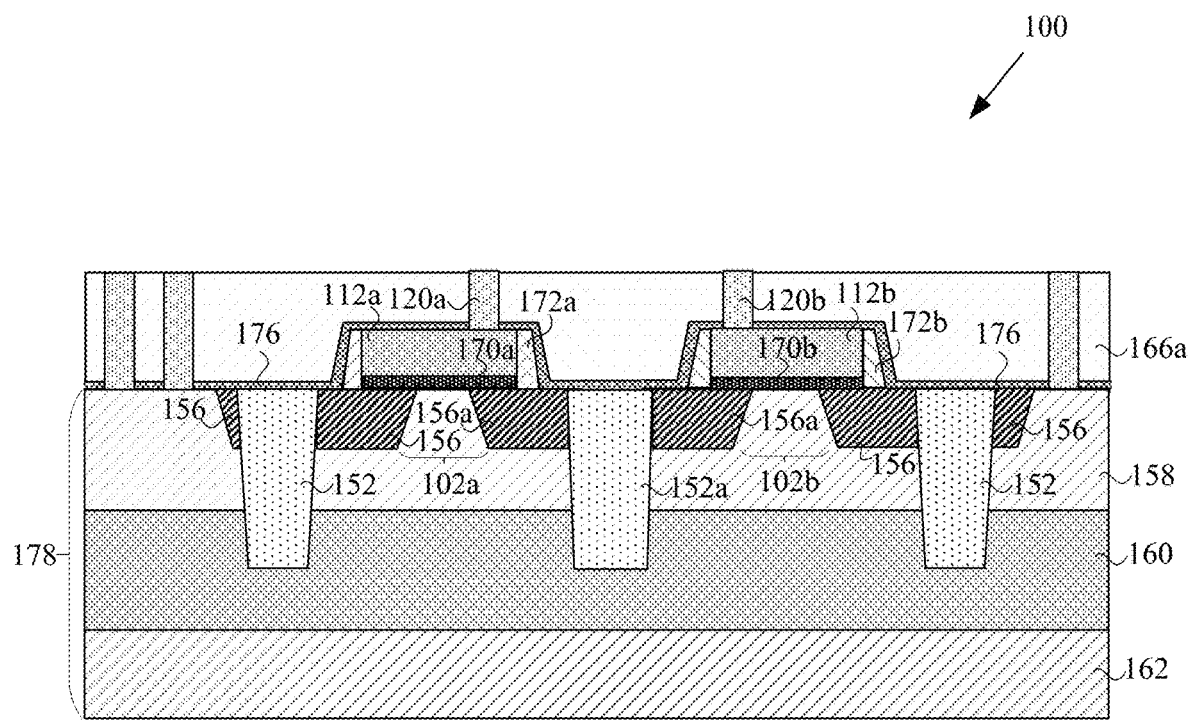

FIG. 4 is a cross-section view of a partially completed nonvolatile memory device array 100 after formation of an inter layer dielectric layer 166a and contact pillars 120a and 120b, according to an embodiment of the disclosure. A layer of suitable dielectric material, for example silicon dioxide, high density plasma (HDP) undoped silicate glass (USG), tetraethyl orthosilicate (TEOS), or any other suitable dielectric material, may be deposited over the etch stop layer 176 by a suitable deposition process such as chemical vapor deposition, atomic layer deposition, physical vapor deposition or any other suitable deposition processes to thereby form the inter layer dielectric layer 166a. An opening may be formed in the inter layer dielectric layer 166a and the etch stop layer 176 to expose a portion of the first array 112a and the second array 112b of floating gates. The opening may be formed by a conventional photolithography process followed by a wet or dry etch. A layer of suitable conductive material, for example tungsten (W), may be deposited in the opening by a suitable deposition process such as chemical vapor deposition, atomic layer deposition, physical vapor deposition or any other suitable deposition processes. A suitable planarization process such as chemical mechanical planarization may be used to remove a portion of the tungsten layer from a top surface of the inter layer dielectric layer 166a leaving behind another portion of the tungsten layer in the opening to thereby form the contact pillar 120a over the first array of floating gates 112a and the contact pillar 120b over the second array of floating gates 112b.

Figure 5:
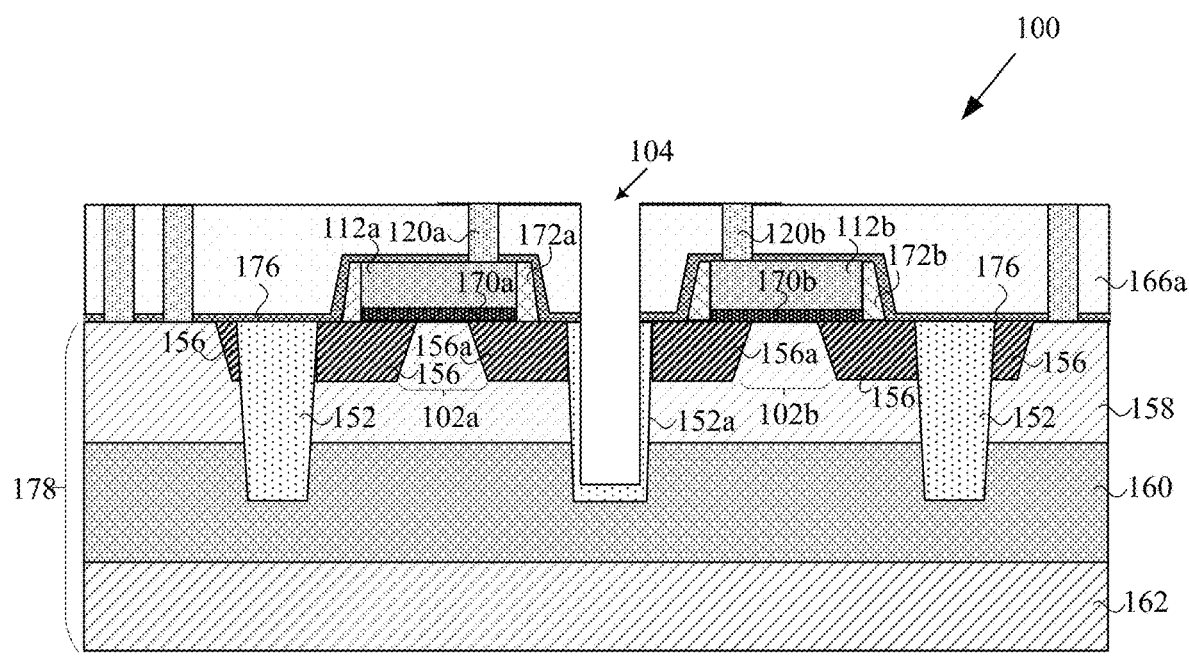

FIG. 5 is a cross-section view of a partially completed nonvolatile memory device array 100 after formation of an opening 104 in the inter layer dielectric layer 166a, the etch stop layer 176 and a portion of the first isolation region 152a, according to an embodiment of the disclosure. Referring to FIG. 5, the opening 104 may be formed by a conventional photolithography process followed by a wet or dry etch. The opening 104 may be formed in the inter layer dielectric layer 166a and the etch stop layer 176 between the first array 112a and the second array 112b of floating gates. In one embodiment, the opening 104 may extend to a portion of the first isolation region 152a between the first 102a and the second 102b active regions. The first isolation region 152a may be laterally displaced from the first array 112a and the second array 112b of floating gates. In a preferred embodiment, a portion of the first isolation region 152a may be arranged over a side surface and a bottom surface of the opening 104. In an alternative embodiment, the opening 104 may extend to a bottom surface of the first isolation region 152a to expose a portion of the first dielectric layer 160 at the bottom surface of the opening 104.

Figure 6:
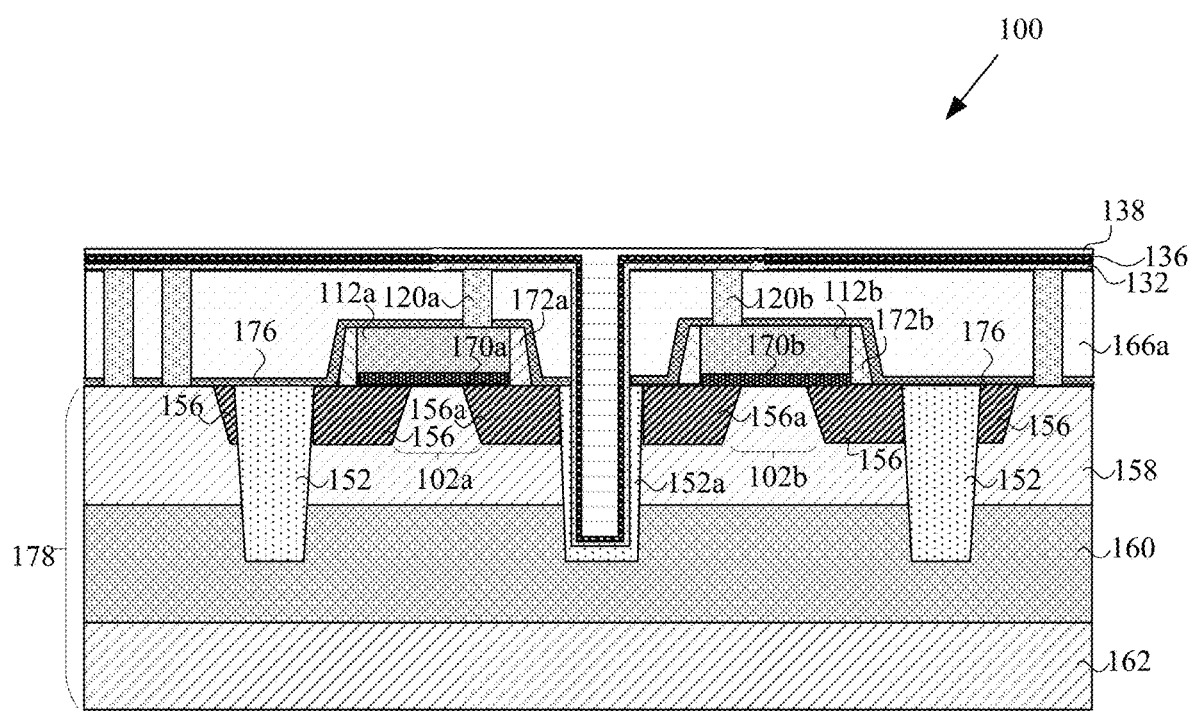

FIG. 6 is a cross-section view of a partially completed nonvolatile memory device array 100 after formation of a layer of conductive material 132, a dielectric layer 136 and a layer of conductive material 138, according to an embodiment of the disclosure. Referring to FIG. 6, a layer of a suitable conductive material, for example titanium nitride (TiN), Titanium (Ti) or any other suitable conductive material may be deposited over the inter layer dielectric layer 166a, the contact pillar 120a over the first array of floating gates 112a, the contact pillar 120b over the second array of floating gates 112b and the side surface and the bottom surface of the opening 104 to thereby form the conductive material layer 132. A layer of suitable high dielectric constant dielectric material, for example hafnium oxide (HfO$_2$), silicon nitride (Si$_3$N$_4$), aluminum oxide (Al$_2$O$_3$), tantalum oxide (Ta$_2$O$_5$), zirconium oxide (ZrO$_2$), hafnium silicate (HfSiO$_4$) or any other suitable high dielectric constant dielectric material may be deposited over the layer of conductive material 132 to thereby form the dielectric layer 136. A layer of suitable conductive material, for example tungsten (W), Aluminum (Al) or any other suitable conductive material may be deposited over the dielectric layer 136 and fill up the opening 104, thereby forming the conductive material layer 138. The deposition processes of the layer of conductive material 132, the dielectric layer 136 and the layer of conductive material 138 may be by a suitable deposition process such as chemical vapor deposition, atomic layer deposition, physical vapor deposition or any other suitable deposition processes.

Figure 7:
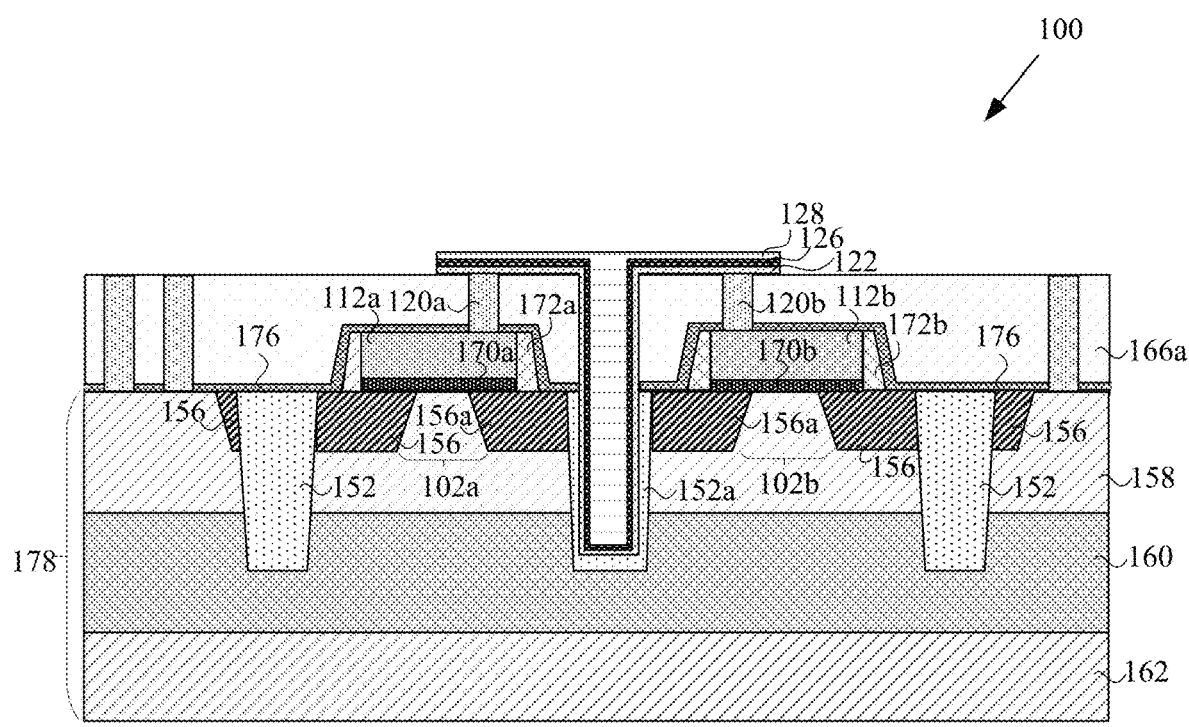

FIG. 7 is a cross-section view of a partially completed nonvolatile memory device array 100 after formation of a first electrode 122, a dielectric layer 126 and a second electrode 128, according to an embodiment of the disclosure. Referring to FIG. 7, the conductive layer 138 may be patterned to form the second electrode 128 of a metal-insulator-metal capacitor 108. A suitable patterning process, for example, a lithographic process, may be used to leave behind a portion of the conductive layer 138 in the opening 104 in the inter layer dielectric layer 166a and at least partially over the top surface of the inter layer dielectric layer 166a. The dielectric layer 136 may also be patterned simultaneously with conductive layer 138 or separately to form the dielectric layer 126. The conductive layer 132 may similarly be patterned simultaneously with conductive layer 138 and dielectric layer 136 or separately to form the first electrode 122 of the metal-insulator-metal capacitor 108. In an example, the patterning of the conductive layer 138, the dielectric layer 136 and the conductive layer 132 may be by a conventional photolithography process followed by a wet or dry etch process.

The nonvolatile memory device array 100 of FIG. 7 is further processed to form the final device shown in FIG. 1B. Referring back to FIG. 1B, a cross-section view of a nonvolatile memory device array 100 after formation of a metallization layer 168 and inter metal dielectric (IMD) layer 166b is shown, according to an embodiment of the disclosure. The metallization layer 168 may be formed by a conventional lift-off process. For example, a layer of photoresist may be deposited over a top surface of the inter layer dielectric layer 166a and the second electrode 128 of the metal-insulator-metal capacitor 108. An opening may be formed in the photoresist layer by exposure and developing to expose the second electrode 128 of the metal-insulator-metal capacitor 108. A layer of suitable conductive material, for example copper (Cu), aluminum (Al) or any other suitable conductive material may be deposited in the opening by a suitable deposition process such as electroplating, chemical vapor deposition, physical vapor deposition or any other suitable deposition processes. The photoresist layer may be removed to leave behind a portion of the copper layer over the second electrode 128 of the metal-insulator-metal capacitor 108 to thereby form the metallization layer 168. A suitable dielectric material, for example silicon dioxide, undoped silicate glass (USG), fluorinated silicate glass (FSG), tetraethyl orthosilicate (TEOS), or any other suitable dielectric material, may be deposited over the inter layer dielectric layer 166a and the metallization layer 168 to thereby form inter metal dielectric layer 166b.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A nonvolatile memory device comprising:
   a floating gate over a first active region, wherein the first active region is in an active layer of a substrate;
   a metal-insulator-metal (MIM) capacitor laterally adjacent to the floating gate, wherein a portion of the metal-insulator-metal capacitor is in the active layer; and
   a contact pillar connecting a first electrode of the metal-insulator-metal capacitor to the floating gate.

2. The nonvolatile memory device of claim 1, wherein the substrate comprises a first dielectric layer under the active layer, and a lower portion of the metal-insulator-metal capacitor extends vertically to the first dielectric layer.

3. The nonvolatile memory device of claim 2, wherein the lower portion of the metal-insulator-metal capacitor extends into an upper portion of the first dielectric layer in the substrate.

4. The nonvolatile memory device of claim 1, wherein an upper portion of the metal-insulator-metal capacitor extends vertically in an inter layer dielectric (ILD) layer above the substrate.

5. The nonvolatile memory device of claim 4, wherein the upper portion of the metal-insulator-metal capacitor further comprises:
an extension portion extending laterally in an inter metal (IMD) dielectric layer above the inter layer dielectric layer.

6. The nonvolatile memory device of claim 5, wherein the extension portion at least partially overlaps laterally with the floating gate.

7. The nonvolatile memory device of claim 1 further comprising:
a first isolation region in the substrate surrounding a lower portion of the metal insulator-metal capacitor.

8. The nonvolatile memory device of claim 7 further comprising:
a second isolation region in the active layer of the substrate, wherein the second isolation region is adjacent to an upper portion of the first isolation region.

9. The nonvolatile memory device of claim 8, wherein the first isolation region and the second isolation region are between the lower portion of the metal-insulator-metal capacitor and the first active region below the floating gate.

10. The nonvolatile memory device of claim 1, wherein the first electrode of the metal-insulator-metal capacitor is conformal to a side surface and a bottom surface of the metal-insulator metal capacitor.

11. An array of nonvolatile memory devices comprising:
a first active region and a second active region in an active layer of a substrate;
a first isolation region and a second isolation region adjacent to the first isolation region between the first active region and the second active region;
a first array of floating gates over the first active region and a second array of floating gates over the second active region;
a metal-insulator-metal capacitor laterally adjacent to the floating gates, wherein a lower portion of the metal-insulator-metal capacitor is in the first isolation region in the active layer and a first dielectric layer in the substrate; and
a contact pillar connecting a first electrode of the metal-insulator-metal capacitor to each floating gate.

12. The nonvolatile memory device of claim 11, wherein the metal-insulator-metal capacitor extends across at least part of a length of the first active region and the second active region.

13. The nonvolatile memory device of claim 12, wherein the substrate comprises the first dielectric layer and the active layer over the first dielectric layer.

14. The nonvolatile memory device of claim 13, wherein the lower portion of the metal-insulator-metal capacitor extends vertically in the active layer and an upper portion of the first dielectric layer in the substrate.

15. The nonvolatile memory device of claim 14, wherein an upper portion of the metal-insulator-metal capacitor extends vertically in an inter layer dielectric (ILD) layer above the substrate.

16. The nonvolatile memory device of claim 15, wherein the upper portion of the metal-insulator-metal capacitor further comprises:
an extension portion extending laterally in an inter metal dielectric (IMD) layer above the inter layer dielectric layer and at least partially overlaps laterally with the floating gates.

* * * * *